United States Patent [19]

Arduengo, III et al.

[11] Patent Number: 5,272,194
[45] Date of Patent: Dec. 21, 1993

[54] PROCESS FOR PREPARING A STRENGTHENED POLYIMIDE FILM CONTAINING ORGANOMETALLIC COMPOUNDS FOR IMPROVING ADHESION

[75] Inventors: Anthony J. Arduengo, III, Wilmington, Del.; Yia C. Ray, Columbus, Ohio

[73] Assignee: E. I. du Pont de Nemours and Company, Wilmington, Del.

[21] Appl. No.: 822,501

[22] Filed: Jan. 17, 1992

[51] Int. Cl.$^5$ .................. C08K 5/56; C08K 5/57
[52] U.S. Cl. ................. 524/177; 428/473.5; 428/458; 524/178
[58] Field of Search ............ 428/458, 473.5; 524/177, 178, 180; 528/351, 353

[56] References Cited

U.S. PATENT DOCUMENTS

| | | | |
|---|---|---|---|
| 3,063,963 | 11/1962 | Wooten et al. | 524/178 |
| 3,073,785 | 1/1963 | Angelo | 528/353 |
| 3,179,630 | 4/1965 | Endrey | 525/436 |
| 3,240,795 | 3/1966 | Ramsden | 524/178 |
| 3,389,111 | 6/1968 | McKeown et al. | 524/177 |
| 3,577,346 | 5/1971 | McKeown et al. | 252/63.5 |

FOREIGN PATENT DOCUMENTS 1200739 7/1970 United Kingdom .

*Primary Examiner*—Veronica P. Hoke

[57] ABSTRACT

A strengthened polyimide film is described, which has improved adhesion when bonded to a metal foil through a heat-resistant adhesive, containing from 0.02 to 1% by weight, based on the weight of the film, of an organo-metallic compound wherein the metal is tin, bismuth or antimony. A process for preparing a strengthened polyimide film is also described wherein an organometallic compound is introduced into a film-forming polyamic acid polymer prior to the casting step.

15 Claims, No Drawings

PROCESS FOR PREPARING A STRENGTHENED POLYIMIDE FILM CONTAINING ORGANOMETALLIC COMPOUNDS FOR IMPROVING ADHESION

BACKGROUND OF THE INVENTION

The present invention relates to a process for preparing a polyimide film containing small amounts of an organometallic compound, which when cured at a high temperature, provides a film with improved cohesive strength thereby providing better adhesion of the film to a metal foil such as copper, silver, gold or indium.

Polyimide films are well-known for their outstanding properties such as heat resistance, low temperature resistance, chemical resistance, electrical insulation and mechanical strength. Such polyimide films are widely used as electrical insulating films and as flexible printed circuit substrates. In such applications, the polyimide films are usually bonded to a copper foil with an acrylic or epoxy adhesive and, therefore, good cohesive strength in the film and good adhesion are important properties.

U.S. Pat. No. 3,389,111, issued to McKeown et al. on Jun. 18, 1968, discloses a polyimide composition having improved corona resistance containing from 0.1 to 20% by weight of an organometallic compound of a metal selected from Group IVb or Vb of the Periodic Table.

In the present invention, a very small amount of an organometallic compound is incorporated into the polyimide film to improve the cohesive strength of the polyimide, after high temperature curing, thereby improving adhesion. The prior art differs in using much larger amounts of an organometallic compound to improve corona resistance of the polyimide film and does not achieve the desired improvement in cohesive strength by high-temperature curing.

It is an object of the present invention to provide a polyimide film having a structure with improved cohesive properties and which has improved adhesion. It is a further object of the invention to provide a strengthened polyimide film having improved adhesive properties when bonded to metal foils, such as copper, silver, gold or indium, using an epoxy, acrylic or other heat resistant adhesive.

SUMMARY OF THE INVENTION

According to the present invention, there is provided a process for preparing a strengthened polyimide film, which can form a laminate having an adhesive strength of at least 7 pli according to IPC Method 2.4.9 Revision C when bonded to a metal foil through a heat-resistant adhesive, comprising incorporating an organometallic compound wherein the metal is selected from the group consisting of tin, bismuth and antimony into a solution of a polyamic acid precursor of the polyimide; and curing the polyamic acid at a temperature greater than 350° C. for a time sufficient to strengthen the polyimide, wherein the concentration of metal in the final cured polyimide film ranges from 0.02 to 1% by weight.

DETAILED DESCRIPTION OF THE INVENTION

In accordance with the present invention, it has been found that polyimide films having advantageous adhesion properties are formed by adding to a polyamic acid a minor amount of an organometallic compound of a metal selected from the group consisting of tin, bismuth and antimony and converting the polyamic acid to the corresponding polyimide by heating at a temperature greater than 350° C.

The polyimides used in this invention can be made generally as disclosed in U.S. Pat. Nos. 3,179,630 and 3,179,634, the disclosures of which are hereby incorporated by reference. The polyamic acids are made by dissolving substantially equimolar amounts of at least one aromatic dianhydride and at least one aromatic diamine in an organic solvent and agitating the resulting solution under controlled temperature conditions until polymerization of the dianhydride and the diamine is completed.

Suitable dianhydrides for use in the polyimides include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3',4,4'-benzophenone tetracarboxylic dianhydride; 2,2-bis(3,4-dicarboxyphenyl) propane dianhydride; 3,4,9,10-perylene tetracarboxylic dianhydride; bis(3,4-dicarboxyphenyl) propane dianhydride; 1,1-bis(2,3-dicarboxyphenyl) ethane dianhydride; 1,1-bis(3,4-dicarboxyphenyl) ethane dianhydride; bis(2,3-dicarboxyphenyl) methane dianhydride; bis(3,4-dicarboxyphenyl) methane dianhydride; oxydiphthalic dianhydride; bis(3,4-dicarboxyphenyl) sulfone dianhydride; and the like.

Suitable aromatic diamines for use in the polyimides include: 4,4'-diamono diphenyl propane; 4,4'-diamino diphenyl methane; benzidine; 3,4'-dichlorobenzidine; 4,4'-diamon diphenyl sulfide; 3,4'-diamino diphenyl sulfone; 4,4'-diamino diphenyl sulfone; 4,4'-diamino diphenyl ether; 1,5-diamino naphthalene; 4,'-diamino diphenyl diethylsilane; 4,4'-diamino diphenylsilane; 4,4'-diamino diphenyl ethyl phosphine oxide; 4,4'-diamino diphenyl N-methyl amine; 4,4'-diamino diphenyl N-phenyl amine; 1,4-diamino benzene (p-phenylene diamine); 1,3-diamino benzene; 1,2-diamino benzene; and the like.

The preferred polyimide film used in this invention is derived from 4,4'-diamino diphenyl ether and pyromellitic dianhydride.

Copolyimides derived from any of the above diamines and dianhydrides are also operable. Particularly preferred copolyimides are those derived from 15 to 85 mole % of biphenyltetracarboxylic dianhydride, 15 to 85 mole % of pyromellitic dianhydride, 30 to 100 mole % p-phenylene diamine and 0 to 70 mole % of 4,4'-diamino diphenyl ether. Such copolyimides are described in U.S. Pat. No. 4,778,872, which disclosure is also incorporated herein by reference.

The organic solvent must dissolve one or both of the polymerizing reactants and, preferably, will dissolve the polyamic acid polymerization product. The solvent must be substantially unreactive with all of the polymerizing reactants and with the polyamic acid polymerization product.

Preferred organic solvents include normally liquid N,N-dialkylcarboxylamides, generally. Preferred solvents include the lower molecular weight members of such carboxylamides, particularly N,N-dimethylformamide and N,N-dimethylacetamide. Other solvents which may be used are dimethylsulfoxide, N-methyl-2-pyrrolidone, tetramethyl urea, dimethylsulfone, hexamethylphosphoramide, tetramethylene sulfone, and the like. The solvents can be used alone, in combinations with one another or in combinations with poor solvents such as benzene, benzonitrile, dioxane, etc. The amount of solvent used preferably ranges from 75 to 90 weight % of the polyamic acid, since this concentration has been found to give optimum molecular weight.

The polyamic acid solutions are generally made by dissolving the aromatic diamine in a dry solvent and slowly adding the aromatic dianhydride under conditions of agitation and controlled temperature in an inert atmosphere. The aromatic diamine is conveniently present as a 5 to 15 weight percent solution in the organic solvent and the aromatic diamine and aromatic dianhydride are usually used in about equimolar amounts.

The strengthened polyimide film of this invention can be obtained by introducing a minor amount of an organometallic compound containing a metal selected from tin, bismuth and antimony, prior to the casting step, into the film-forming polyamic acid solution or while the polymerization of the polyamid acid is being performed.

The polyamid acid containing the organometallic compound can be cast as either a partially cured "gel film" or a "solvated film". The term "gel film" used herein means a sheet of the polyamic acid polymer which is laden with volatiles, primarily organic solvent, to such an extent that the polymeric material is in a gel-swollen, plasticized, rubbery condition. The gel film thickness generally falls in the range of 2 to 25 mils. The volatile content is usually in the range of 80 to 90% by weight of the gel film. The gel film is self-supporting and partially and incompletely cured, i.e., is at an intermediate stage of curing from polyamic acid to polyimide.

The gel film structure can be prepared by the chemical conversion process described in U.S. Pat. No. 3,410,826 by mixing a chemical converting agent and a catalyst, such as a lower fatty acid anhydride and a tertiary amine, respectively, into the polyamic acid solution at a low temperature, followed by casting the polyamic acid solution in film form on a casting surface and then mildly heating at, for example, 100° C. to activate the conversion agent and catalyst for transforming the cast film to a polyamic acid-polyimide gel film.

The gel film is subsequently dried to remove the water, residual organic solvent, and the remaining conversion chemicals, and the polyamic acid is completely converted to polyimide. The drying can be conducted at relatively mild conditions without complete conversion of polyamic acid to polyimide at that time, or the drying and conversion can be conducted at the same time using higher temperatures. Because the gel film has so much liquid which must be removed during the drying and converting steps, it must be restrained during drying to avoid undesired shrinkage. In continuous production, the film can be held at the edges, such as in a tenter frame using tenter clips or pins for restraint. A polyimide film which is permitted to shrink excessively during drying and conversion is brittle and lacks the superior performance characteristics expected of polyimide film materials.

Preferably, high temperatures are used for short times to dry the film and convert it to polyimide in the same step. It is preferred to heat the film to a temperature of greater than 350° C., most preferably, greater than 400° C. for 15 to 400 seconds. During this drying and converting process, the film is restrained from undue shrinking and, in fact, can be stretched by as much as 200% of its initial dimension prior to completion of the drying and conversion. Stretching can be in any dimension. In film manufacture, stretching can be in either the longitudinal direction or the transverse direction. If desired restraint can also be provided to permit some limited degree of shrinkage. Shrinkage of as much as 15% has been found to provide an adequate product.

A "solvated film" of the polyamic acid is a film which is all polyamic acid or which has only a low polyimide content, for example 0 to 25%, and which is about 50 to 75% by weight polymer and 25 to 50% by weight solvent. Such film is sufficiently strong to be self-supporting.

The solvated polyamic acid can be prepared by casting the polyamic acid solution on a casting surface had heating at a temperature above 50° C. to partially convert the polyamid acid to polyimide. The extent of polyamid acid conversion depends on the temperature employed and the time of exposure, but, generally about 25 to 95% of the amide acid groups are converted to imide groups. The partially converted polyamic acid is then thermally converted to the polyimide by heating at temperatures above 350° C., preferably above 400° C.

The strengthened polyimide film of this invention contains from 0.02 to 1% by weight of metal based on the weight of the final cured polyimide film. When amounts of metal less than 0.02% are used, little improvement in cohesive properties is obtained. Moreover, if the metal concentration exceeds 1% by weight, the polyimide film becomes too brittle. A preferred amount of metal present in the polyimide film ranges from 0.02 to 0.7% by weight and, most preferably, 0.05 to 0.50% by weight.

Although not wishing to be bound by any specific theory, it is believed that the incorporation of the organometallic compound into the polyimide provides crosslinking sites which increase the cohesive strength of the polyimide film. Under the high temperature curing conditions, bonds between the organic and metallic moieties are broken and the resultant organic moieties are vaporized. The remaining metal centers either form coordination complexes with different polyimide chains and/or catalyze an interchain condensation leading to a crosslinked structure which increases the molecular weight and strength of the polyimide film. Accordingly, high temperature curing of the polyimide film at a temperature greater than 350° C., preferably greater than 400° C. is necessary to obtain the catalyst activation and achieve the desired strength improvement.

Organometallic compounds having utility in the invention include dibutyltin diacetate, dibutyltin dilaurate, bis(tributyltin) oxide, tributyltin acetate, tetrabutyltin, triphenylantimony, triphenylbismuth and the like.

Different organometallic compounds of the same metal, which have different characteristics and properties due to the different organic moieties, may be used. For example, an organometallic compound having an organic moiety generated by-product can be selected which is inert or compatible with the process environment, or a liquid, e.g., bis(tributyltin) oxide can be used instead of a powder, e.g., tributyltin acetate. Furthermore, different organometallic compounds have different reaction characteristics when incorporated into the polyamic acid solution. Dibutyltin diacetate accelerates the gelation rate of the polyamic acid solution and reduces the processing time, whereas bis(tributyltin) oxide or tetrabutyltin do not affect the processing characteristics of the polyamic acid solution and may be added either prior to or during the polyamic acid polymerization.

A particularly preferred organometallic compound is bis(tributyltin) oxide which when used in a concentration of from 0.2 to 0.7 weight % provides a peel strength of at least 9 pli when used in adhesively bonded polyimide copper laminates.

The advantageous properties of this invention can be observed by reference to the following examples which illustrate, but do not limit, the invention. All parts and percentages are by weight unless otherwise indicated.

GLOSSARY

PMDA pyromellitic dianhydride
ODA 4,4'-diamino diphenyl ether
DMAC dimethylacetamide

CONTROL EXAMPLE 1

Chemical Conversion

A PMDA/ODA polyamic acid solution (20.3% solids by weight, 30.0 g), was thoroughly mixed with DMAC (12.7 cc) and beta-picoline (3.7 cc) and cooled to about 0° C. in an ice/water bath. Acetic anhydride (3.6 ml) was thoroughly mixed into the solution. The solution was centrifuged to remove the air bubbles and then cast onto a glass plate using a stainless steel rod so that the thickness of the final cured film was approximately 1 mil. The glass plate and film were heated on a hot plate at about 90° C. for 5 minutes. The film was then stripped from the glass plate and restrained in a frame. The film was first cured by placing the frame into a forced air oven for 20 minutes at 250° C. After that, it was further ceuved in a oven at 400° C. for 5 minutes. The film was then removed from the frame.

A two-sided copper laminate was prepared by laminating the polyimide film on both sides with sheets of PYRALUX ® WA acrylic adhesive and copper foils at 177° C. and 100 psi. Adhesion strength of the laminate was determined according to IPC (Institute of Printed Circuits) Method 2.4.9 Revision C. Adhesion results are given in Table 1.

EXAMPLE 1

A 2 weight % solution of dibutyltin diacetate was prepared by dissolving 1 g of dibutyltin diacetate and 1 g of acetic anhydride in 48 g of DMAC.

A PMDA/ODA polyamic acid solution (20.3% solids by weight, 30.0 g) was thoroughly mixed with 12.7 cc DMAC and cooled in an ice/water bath. It was then mixed with 3.6 cc of beta-picoline and 3 cc of the 2% solution of dibutyltin diacetate in DMAC. The polymer solution was quickly mixed with 3.5 cc of ice-cooled acetic anhydride, centrifuged and cast onto a glass plate so that the thickness of the final cured film was approximately 1 mil. The glass plate with the cast film was heated on a hot plate at about 90° C. for 3.5 minutes. The gel film was stripped from the glass plate, restrained on a frame, cured in a forced air oven for 20 minutes at 250° C. and further cured in an oven at 400° C. for 5 minutes. The film was then removed from the frame, laminated on both sides with copper foil and tested for adhesion strength in the same manner as Control Example 1. The tin content in the cured film was 0.36% by weight. Adhesion results are given in Table 1.

EXAMPLE 2

A 2% by weight solution of dibutyltin dilaurate in beta-picoline was prepared by dissolving 1 g dibutyltin dilaurate and 1 g acetic anhydride in 48 g of betapicoline.

Thirty grams of a 20.3% by weight PMDA/ODA polyamic acid solution was mixed with 10 cc DMAC, 1.7 cc betapicoline and 2.0 g of the 2% solution of dibutyltin dilaurate in beta-picoline with ice cooling.

The polymer was quickly mixed with a mixture of 3.5 cc acetic anhydride and 5.0 cc DMAC, centrifuged and cast onto a stainless steel hot plate. The drying, curing and testing of the film were similar to Example 1. The tin content in the cured film was 0.17% by weight. The adhesion results are given in Table 1.

EXAMPLE 3

Five grams of liquid bis(tributyltin) oxide was mixed with 5 g of acetic anhydride. Tributyltin acetate precipitated as a white powder and was dissolved in 240 g DMAC to give a 2% by weight solution of bis(tributyltin) oxide in DMAC.

A PMDA/ODA polyamic acid solution (20.3% solids by weight, 30.0 g) was thoroughly mixed with DMAC (12.7 ml), beta-picoline (3.7 cc), and 1.5 cc of the solution of 2% bis(tributyltin) oxide in DMAC with ice-cooling. Then acetic anhydride (3.6 ml) was thoroughly mixed into the solution. Afterward a film was made in the same manner as for Example 1. The tin content in the final cured film was 0.2% by weight. The adhesion results are given in Table 1.

EXAMPLE 4

A polyimide film was made in a manner similar to Example 3 except that tetrabutyltin, instead of bis(tributyltin) oxide, was used. The tin content in the final cured film was 0.18% by weight. Adhesion results are given in Table 1.

EXAMPLE 5

A polyimide film was made in a manner similar to Example 3 except that triphenylbismuth, instead of bistributyltin) oxide, was used. The bismuth content in the final cured film was 0.63% by weight. The adhesion results are given in Table 1.

EXAMPLE 6

A polyimide film was made in a manner similar to Example 3 except that triphenylantimomy, instead of bis(tributyltin) oxide, was used. The antimony content in the final cured film was 0.23% by weight. The adhesion results are given in Table 1.

CONTROL EXAMPLE 2

Thermal Conversion

A PMDA/ODA polyamic acid solution (20.3% solids by weight, 30.0 g) was thoroughly mixed with DMAC (20 cc) and centrifuged to remove bubbles. The solution was cast into a film on a glass plate so that the thickness of the final cured film was approximately 1 mil. The glass plate was heated on a hot plate for 20 minutes at 90° C. The partially dried film was then stripped from the plate and restrained onto a frame. The curing, laminating and adhesion testing of the film was similar to Example 1. The adhesion results are given in Table 1.

EXAMPLE 7

A thermally-converted film was made in a manner similar to Control Example 2 except that a solution of 2% bis(tributyltin) oxide in DMAC was added to the polymer solution so that the final cured film contained 0.67% by weight of tin. The adhesion results are given Table 1.

TABLE 1

| Ex. No. | Organometallic Compound | Metal Conc. (wt %) | Adhesion Strength (pli) | |
|---|---|---|---|---|
| | | | Casting Side | Air Side |
| Control 1 | — (**) | 0.0 | 2.5 | 2.1 |
| 1 | dibutyltin diacetate (**) | 0.36 | 7.6 | 8.7 |
| 2 | dibutyltin dilaurate (**) | 0.17 | 10.2 | 12.2 |
| 3 | bis(tributyl-tin)oxide (**) | 0.20 | 12.2 | 9.7 |
| 4 | tetrabutyl-tin (**) | 0.18 | 7.2 | 8.2 |
| 5 | triphenyl-bismuth (**) | 0.63 | 7.2 | 7.6 |
| 6 | triphenyl-antimony (**) | 0.23 | 9.0 | 9.6 |
| Control 2 | — (*) | 0.00 | 1.9 | 1.7 |
| 7 | bis(tributyltin) oxide (*) | 0.67 | 12.4 | 10.1 |

(*) thermal conversion
(**) chemical conversion

What is claimed:

1. A process for preparing a strengthened polyimide film which can form a laminate having an adhesive strength of at least 7 pli, according to IPC Method 2.4.9 Revision C, when bonded to a metal foil through a heat resistant adhesive, comprising incorporating an organometallic compound selected from the group consisting of dibutyltin diacetate, dibutyltin dilaurate and tributyltin acetate into a solution of a polyamic acid precursor; and curing the polyamic acid at a temperature greater than 350° C. for a time sufficient to strengthen the polyimide, wherein the concentration of tin in the final cured polyimide film ranges from 0.02 to 1% by weight.

2. The process for preparing the polyimide film of claim 1 wherein the polyimide is derived from pyromellitic dianhydride and 4,4'-diamino diphenyl ether.

3. The process for preparing the polyimide film of claim 1 wherein the concentration of metal in the final cured polyimide film ranges from 0.2 to 0.7% by weight.

4. The process for preparing the polyimide film of claim 3 wherein the concentration of metal in the final cured polyimide film ranges from 0.05 to 0.5% by weight.

5. A strengthened polyimide film, which can form a laminate having an adhesive strength of at least 7 pli according to IPC Method 2.4.9 Revision C, when bonded to a metal foil through a heat-resistant adhesive, containing an organometallic compound selected from the group consisting of dibutyltin diacetate, dibutyltin dilaurate and tributyltin acetate wherein said organometallic compound is incorporated into a polyamic acid precursor of said polyimide and said polyamic acid precursor is cured at a temperature greater than 350° C. to strengthen the polyimide, and wherein said tin is present in an amount of from 0.02 to 1% by weight based on the weight of the film.

6. The polyimide film of claim 5 wherein the polyimide is derived from pyromellitic dianhydride and 4,4'-diamino diphenyl ether.

7. The polyimide film of claim 5 wherein the metal is present in an amount of from 0.02 to 0.7% by weight.

8. The polyimide film of claim 7 wherein the metal is present in an amount of from 0.05 to 0.5% by weight.

9. A laminate comprising in sequence
   (a) a strengthened polyimide film containing an organometallic compound selected from the group consisting of dibutyltin diacetate, dibutyltin dilaurate, bis(tributyltin)oxide, tributyltin acetate, tetrabutyltin, triphenyl antimony and triphenyl bismuth, wherein said organometallic compound is incorporated into a polyamid acid precursor of said polyimide and said polyamic acid precursor is cured at a temperature greater than 350° C. to strengthen the polyimide, and wherein said tin, bismuth or antimony is present in an amount of from 0.02 to 1% by weight based on the weight of the film;
   (b) a heat resistant adhesive; and
   (c) a metal foil wherein the foil is bonded to the polyimide film through the heat resistant adhesive with an adhesive strength of at least 7 pli according to IPC method 2.4.9, Revision C.

10. The laminate of claim 9 wherein the polyimide is derived from pyromellitic dianhydride and 4,4'-diamino diphenyl ether.

11. The laminate of claim 9 wherein the metal is copper.

12. The laminate of claim 9 wherein the metal is silver.

13. The laminate of claim 9 wherein the metal is gold.

14. The laminate of claim 9 wherein the metal is indium.

15. The laminate of claim 9 wherein the adhesive is an epoxy or acrylic adhesive.

* * * * *